United States Patent
Kyung

(10) Patent No.: US 6,584,028 B2
(45) Date of Patent: Jun. 24, 2003

(54) MEMORY SYSTEM AND SEMICONDUCTOR MEMORY DEVICE FOR ENHANCING BUS EFFICIENCY AND REFRESH METHOD OF THE SEMICONDUCTOR MEMORY DEVICE

(75) Inventor: Kye-hyun Kyung, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/044,323

(22) Filed: Jan. 10, 2002

(65) Prior Publication Data

US 2003/0007405 A1 Jan. 9, 2003

(30) Foreign Application Priority Data

Jun. 27, 2001 (KR) .................................. 2001-0037052

(51) Int. Cl.[7] ................................................ G11C 7/00
(52) U.S. Cl. ................... 365/222; 365/230.03; 365/203
(58) Field of Search ............................ 365/222, 230.03, 365/203

(56) References Cited

U.S. PATENT DOCUMENTS 5,649,161 A * 7/1997 Andrade et al. ............ 711/167
6,233,195 B1 * 5/2001 Yamazaki et al. ...... 365/230.03
6,310,814 B1 * 10/2001 Hampel et al. ............. 365/222

* cited by examiner

Primary Examiner—Huan Hoang
(74) Attorney, Agent, or Firm—Mills & Onello, LLP

(57) ABSTRACT

A memory system and a semiconductor memory device, which are capable of increasing memory bus efficiency and a refresh method of the semiconductor memory device are provided. A method for refreshing an open bank of a semiconductor memory device with a memory controller in a memory system including a plurality of semiconductor memory devices and the memory controller for controlling the plurality of semiconductor memory devices includes (a) applying a refresh command to each of the plurality of semiconductor memory device in order to the open bank; (b) precharging the open bank with each of the plurality of semiconductor memory devices if the refresh command is applied to the each of the plurality of semiconductor memory devices; and (c) refreshing the precharged bank with each of the plurality of semiconductor memory devices. The memory controller does not need to apply a precharge command to the semiconductor memory device before applying a refresh command to the semiconductor memory device but applies only the refresh command to the semiconductor memory device in order to perform a refresh operation on an open bank of the semiconductor memory device. In addition, the semiconductor memory device automatically performs an activation operation on the completely refreshed bank after refreshing the open bank, thereby considerably increasing the efficiency of the memory bus.

10 Claims, 4 Drawing Sheets

MEMORY SYSTEM AND SEMICONDUCTOR MEMORY DEVICE FOR ENHANCING BUS EFFICIENCY AND REFRESH METHOD OF THE SEMICONDUCTOR MEMORY DEVICE

BACKGROUND OF THE INVENTION

1. Field of the Invention

The present invention relates to a semiconductor memory system, and more particularly, to a memory system and a semiconductor memory device for enhancing bus efficiency and a refresh method of the semiconductor memory device.

2. Description of the Related Art

Dynamic random access memory (DRAM) devices must periodically perform refresh operations. As the memory capacity of DRAM devices increases, the number of refresh operations to be performed for a given time also increases. Accordingly, a refresh command accounts for a larger percentage of DRAM control commands in a memory system using DRAMs, and thus bus efficiency continues to decrease.

For example, in the case of a 256 Mbit synchronous dynamic random access memory (SDRAM) operating at a frequency of 100 MHz with a tRFC of 70 ns and a refresh interval of 32 ms and having a page size of 1 Kbyte, the percentage of the time required to perform a refresh operation with respect to the whole operational time of the SDRAM can be obtained from Equation (1). Here, the tRFC represents a minimum time taken to activate and precharge a wordline during a refresh operation.

$$\frac{256 \text{ Mbit}}{1 \text{ Kbyte}} \times \frac{70 \text{ ns}}{32 \text{ ms}} = 7.168\% \quad (1)$$

In the case of a 4 Gbyte SDRAM operating at a frequency of 100 MHz with a tRFC of 70 ns and a refresh interval of 32 ms and having a page size of 4 Kbyte, the percentage of the time required to perform a refresh operation with respect to the whole operational time of the SDRAM can be obtained from Equation (2).

$$\frac{4 \text{ Gbit}}{4 \text{ Kbyte}} \times \frac{70 \text{ ns}}{32 \text{ ms}} \times 100 = 28.672\% \quad (2)$$

Referring to Equations (1) and (2), as the memory capacity of semiconductor memory devices increases, the percentage of the time taken to perform a refresh operation with respect to the operational time of the SDRAM increases, and thus the efficiency of memory bus usage decreases.

In the case of recently developed rambus DRAM, during selective refresh of particular banks in the DRAM which is comprised of a plurality of banks so as to increase the efficiency of a memory bus, the other banks not to be refreshed can perform operations other than a refresh operation. In this case, it is still impossible to apply operations other than a refresh operation to the particular banks being refreshed during the refresh time period tRFC. In such a memory device which is capable of selectively performing refresh operations on particular banks and thus increasing bus efficiency, supposing that tRRD=17.5 ns and activation commands are consecutively applied to the memory device, the percentage of the time period by which the refresh command operations occupy the memory bus can be obtained from Equation (3), which represents the case of the 256 Mbit SDRAM, and Equation (4), which represents the case of the 4 Gbit SDRAM.

$$256 \text{ Mbit SDRAM: } \frac{256 \text{ Mbit}}{1 \text{ KByte}} \times \frac{17.5 \text{ ns}}{32 \text{ ms}} \times 100 = 1.792\% \quad (3)$$

$$4 \text{ Gbit SDRAM: } \frac{4 \text{ Gbit}}{4 \text{ KByte}} \times \frac{17.5 \text{ ns}}{32 \text{ ms}} \times 100 = 7.168\% \quad (4)$$

Comparing Equations (1) and (3), in the case of selectively refreshing particular banks, the percentage of the memory bus occupied by a refresh command can be considerably decreased. However, with reference to Equation (4), memory devices having a large memory capacity, such as the 4 Gbit SDRAM, still have a problem with a high memory bus occupancy percentage by the refresh command.

In addition, in actually operating a memory device, particular banks, to which refresh commands are desirably applied, may be in an open state, and in that case, precharge commands must be applied to the open banks before applying the refresh commands to the open banks. Here, "the open banks" indicate that the wordline of each of the banks is enabled.

FIG. 1 is a diagram illustrating commands externally applied to refresh an open bank and the operation of a semiconductor memory device in accordance with such commands. For the convenience of explanation, it is supposed that a semiconductor memory device dealt with in FIG. 1 periodically performs refresh operations and every command applied to the semiconductor memory device is generated in a memory controller.

Referring to FIG. 1, the memory controller initially applies a precharge command P1 to the semiconductor memory device in order to refresh a bank i in an active state and then applies a refresh command R1 to the semiconductor memory device. The semiconductor memory device performs a precharge operation P2 on the bank i in response to the precharge command P1 and performs a refresh operation on the bank i by activating A4 a wordline of the bank i in response to the refresh command R2. After the wordline of the bank i is refreshed, the semiconductor memory device performs a precharge operation P3 on the refreshed wordline of the bank i. At this time, a row address (the address of a wordline) required for a refresh operation is generated in itself in the semiconductor memory device. After the wordline of the bank i is refreshed, the memory controller applies an activation command A2 to the semiconductor memory device in order to activate the bank i. The semiconductor device activates A5 the wordline of the bank i in response to the activation command A2.

In other words, the memory controller must apply the precharge command P1, the refresh command R1, and the activation command A2 to a semiconductor memory device in order to refresh an open bank and reopen the refreshed bank in the semiconductor memory device. Accordingly, the number of commands, which must be applied to the semiconductor memory device in order to refresh an open bank, increases, and thus the bus efficiency decreases.

SUMMARY OF THE INVENTION

To address the above-described limitations, it is a first object of the present invention to provide a refresh method of a semiconductor memory device, which is capable of increasing bus efficiency by performing a refresh operation on an open bank after precharging the bank without a precharge command being applied.

It is a second object of the present invention to provide a semiconductor memory device, which is capable of increasing bus efficiency by performing a refresh operation on an open bank in response to a refresh command.

It is a third object of the present invention to provide a memory system, which is capable of increasing bus efficiency by performing a refresh operation on memory devices following the above refresh method.

In one aspect, the present invention is directed to a method for refreshing an open bank of a semiconductor memory device under control of a memory controller in a memory system comprising a plurality of semiconductor memory devices and the memory controller for controlling the plurality of semiconductor memory devices. A refresh command is received from the memory controller in order to refresh the open bank. The open bank is recharged in response to the refresh command, and the precharged bank is refreshed.

The method may further comprise the step of activating the refreshed bank so as to restore the refreshed bank to its former condition.

In another aspect, the present invention is directed to a semiconductor memory device, which refreshes a bank in response to a refresh command generated by a memory controller. The semiconductor memory device comprises a refresh controller, which first precharges the bank and then refreshes the precharged bank in response to the refresh command, if the bank to be refreshed is an open bank.

The refresh controller may comprise a precharger precharging the corresponding bank in response to a precharge signal; an activator activating the corresponding bank in response to an activation signal; and a controller sequentially generating the precharge signal, the activation signal, and the precharge signal at predetermined time intervals in response to the refresh command if the bank to be refreshed is an open bank.

The refresh controller may activate the open bank so as to restore the open bank to its former condition after the open bank is refreshed.

In another aspect, the present invention is directed to a memory system comprising a plurality of semiconductor memory devices and a memory controller for controlling the semiconductor memory device. Each of the plurality of semiconductor memory devices comprises a refresh controller, which precharges a bank to be refreshed and then refreshes the precharged bank in response to the refresh command if the bank to be refreshed is an open bank.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

A memory system and a semiconductor memory device according to the present invention, which are capable of increasing bus efficiency, and a refresh method of the semiconductor memory device according to the present invention will now be described greater in detail with reference to the accompanying drawings.

Figure 1:
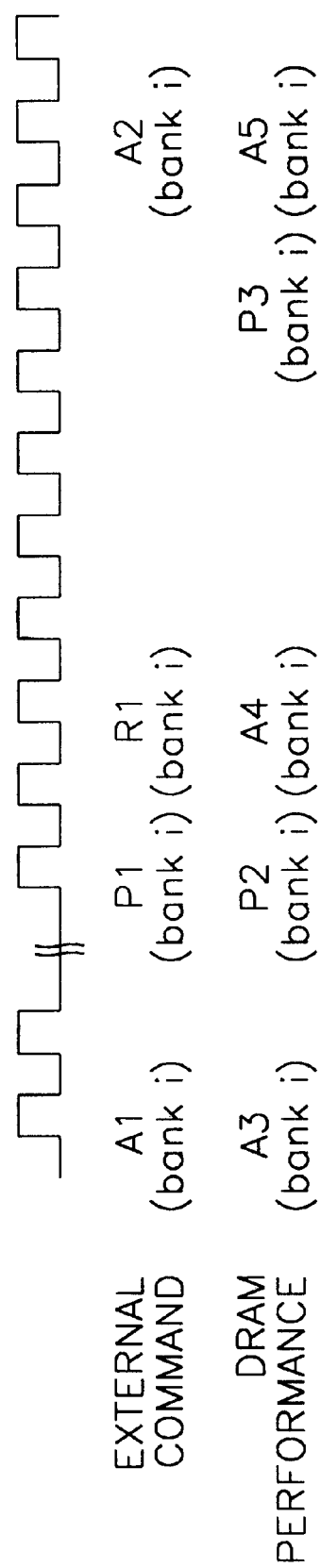
FIG. 1 is a diagram illustrating commands externally applied to refresh an open bank and the operation of a semiconductor memory device in response to the commands, in accordance with the prior art.
Figure 2:
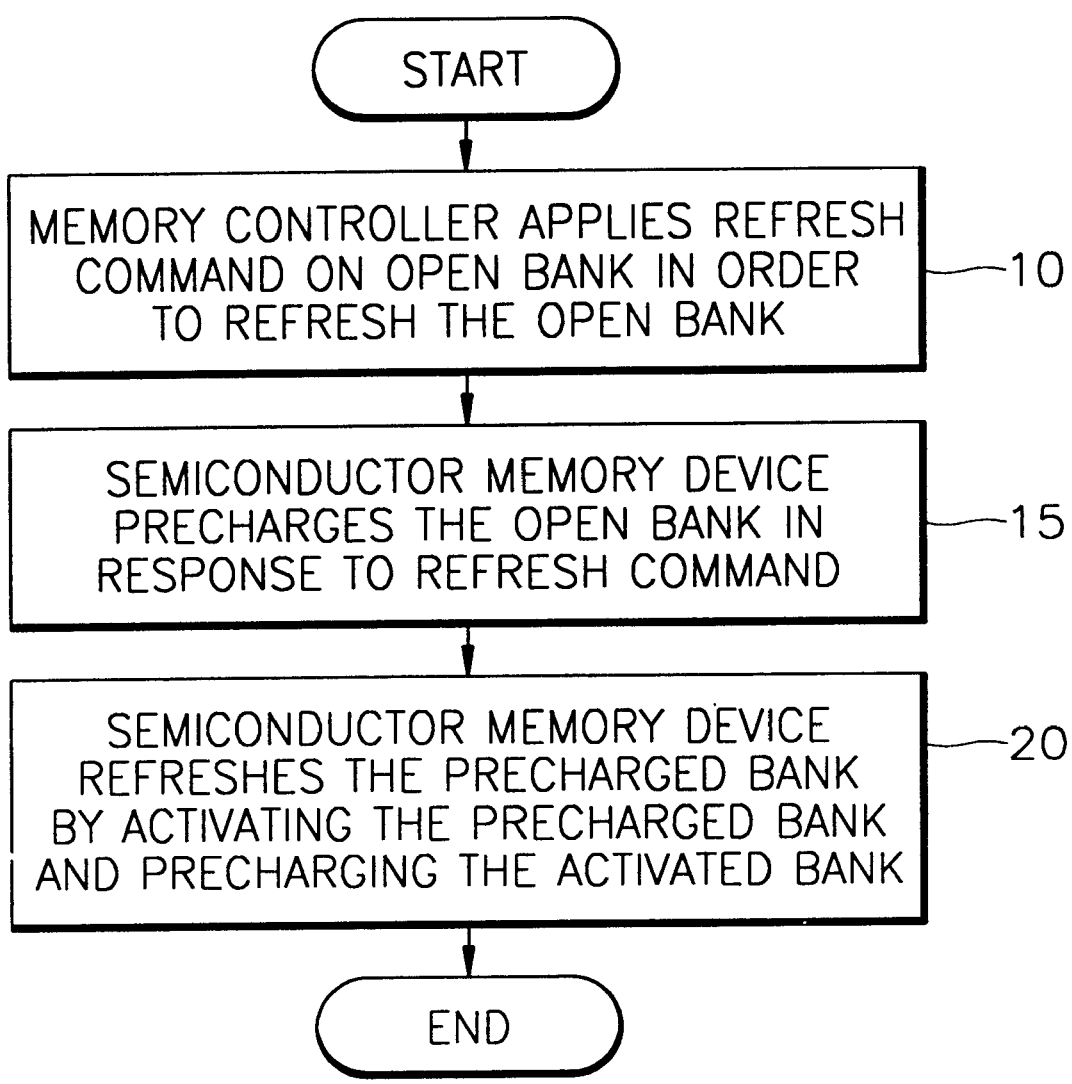
FIG. 2 is a flow chart illustrating a method for refreshing an open bank in a semiconductor memory device according to the present invention.

FIG. 2 is a flow chart illustrating a method for refreshing an open bank in a semiconductor memory device according to the present invention. For the convenience of explanation, refresh operations of the semiconductor memory device are controlled by a memory controller. Referring to FIG. 2, if a refresh command for refreshing an open bank is applied by the memory controller to the semiconductor memory device in step 10, the semiconductor memory device precharges, refreshes, and precharges the open bank in steps 15 and 20.

Figure 3:
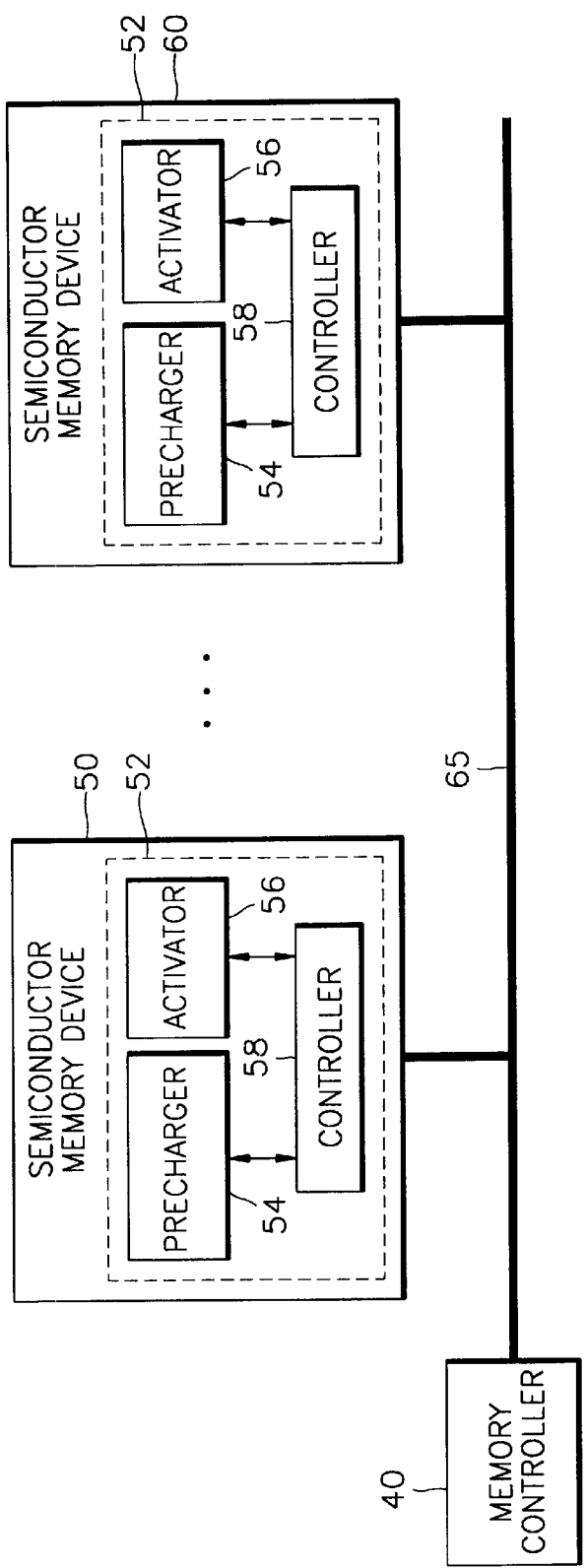
FIG. 3 is a block diagram illustrating a memory system according to a first embodiment of the present invention, which performs the refresh method shown in FIG. 2.

FIG. 3 is a block diagram illustrating a memory system including a semiconductor memory device performing the refresh method according to an embodiment of the present invention shown in FIG. 2. Referring to FIG. 3, the memory system includes a memory controller 40, a memory bus 65, and a plurality of semiconductor memory devices 50, . . . , 60. Each of the semiconductor memory devices 50, . . . , 60 includes a refresh controller 52.

Referring to FIG. 3, the memory controller 40 applies commands for controlling the semiconductor memory devices 50, . . . , 60 to the semiconductor memory devices 50, . . . , 60 via the memory bus 65 and thus controls the operation of the semiconductor memory devices 50, . . . , 60.

Each of the semiconductor memory devices 50, . . . , 60 performs a refresh operation on a predetermined bank in response to a refresh command applied by the memory controller 40. If the predetermined bank to be refreshed is an inactive bank, the predetermined bank is only refreshed. However, if the predetermined bank to be refreshed is an active bank, in other words, if the predetermined bank to be refreshed is an open bank, the predetermined bank must first be precharged first and then refreshed. Accordingly, if a refresh command for an open bank is applied from the memory controller 40 to the semiconductor memory devices 50, . . . , 60, the refresh controller 52 of each of the semiconductor memory devices 50, . . . , 60 precharges the open bank and then refreshes the open bank. Preferably, the refresh controller 52 includes a precharger 54, an activator 56, and a controller 58.

If a refresh command for an open bank is applied to the semiconductor memory devices 50, . . . , 60 via the memory bus 65, the controller 58 sequentially generates a precharge signal, an activation signal, and another precharge signal at predetermined time intervals.

The precharger 54 precharges the open bank in response to the precharge signal generated by the controller 58 and the activator 56 activates the open bank to be refreshed in response to the refresh signal generated by the controller 58.

Referring to FIGS. 2 and 3, a refresh method to be performed on an open bank in the memory system shown in FIG. 3 will be described in detail. For the convenience of explanation, a refresh method of only the semiconductor memory device 50 shown in FIG. 3 will be described because the operations of other semiconductor memory devices are the same as the operation of the semiconductor memory device 50.

Referring to FIGS. 2 and 3, the memory controller 40 applies a refresh command for refreshing the semiconductor memory device 50 to the semiconductor memory device 50 in step 10.

When the refresh command is applied to the semiconductor memory device 50, the controller 58 of the semiconductor memory device 50 determines whether the bank to be refreshed is an open bank. If the bank to be refreshed is determined to be an open bank, the controller 58 generates and transmits a precharge signal to the precharger 54, and, as a result, the precharger 54 precharges the open bank in response to the precharge signal in step 15. If the bank to be refreshed is not an open bank, the controller 58 sequentially generates an activation signal and a precharge signal at a predetermined time interval. The activator 56 and the precharger 54 perform a refresh operation on the open bank by activating and precharging the corresponding bank.

After a predetermined time period has passed since step 15, the controller 58 generates a precharge signal and sequentially generates an activation signal and a precharge signal at a predetermined time interval. The activator 56 and the precharger 54 perform a refresh operation in step 20 by activating and precharging the corresponding bank.

The bank refreshed in the steps 15 and 20 is a bank opened before the refresh operation is performed and can be opened again after the refresh operation is completed. In this case, after the step 20, the memory controller 40 applies the activation command to the semiconductor memory device 50 and activates the bank refreshed in step 20.

Figure 4:
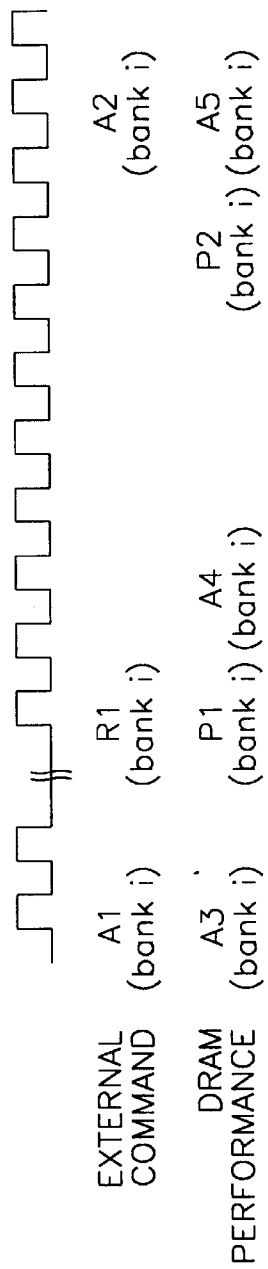
FIG. 4 is a diagram illustrating one example of refresh operations to be performed on an open bank in the semiconductor memory device of FIG. 3.

FIG. 4 is a diagram illustrating one example of refresh operations to be performed on an open bank i of the semiconductor memory device of FIG. 3. Referring to FIGS. 3 and 4, a bank i in the semiconductor memory device 50 is activated in response to an activation command A1 applied from the memory controller 40. When the memory controller 40 applies a refresh command R1 to the semiconductor memory device 50 in order to refresh the open bank i, the refresh controller 52 of the semiconductor memory device 50 initially precharges P1 the open bank i, activates A4 the precharged bank i, and precharges P2 the activated bank i again after the activation of the bank is completed, thereby completing a refresh operation. The memory controller 40 can apply an activation command A2 to the semiconductor memory device 50 in order to re-activate the bank i, which has been in an open state before the refresh operation. The bank i of the semiconductor memory device 50 is activated A5 in response to the activation command A2.

As described above, in the memory system according to the present invention, the memory controller 40 does not have to apply a precharge command to the semiconductor memory device 50 before applying a refresh command to the semiconductor memory device 50 but applies only a refresh command to the semiconductor memory device 50 in order to perform a refresh operation on an open bank. Accordingly, it is possible to reduce the number of commands applied to the semiconductor memory device 50 via the memory bus 65 to refresh the open bank, thereby increasing the efficiency of the memory bus 65.

As described above, when the open bank is refreshed and the refreshed bank is opened again, the memory controller 40 applies the activation command A2 to the semiconductor memory devices 50 and 52. However, the controller 58 of each of the semiconductor memory devices 50 and 52 can re-open the refreshed bank after the open bank is completely refreshed.

Figure 5:
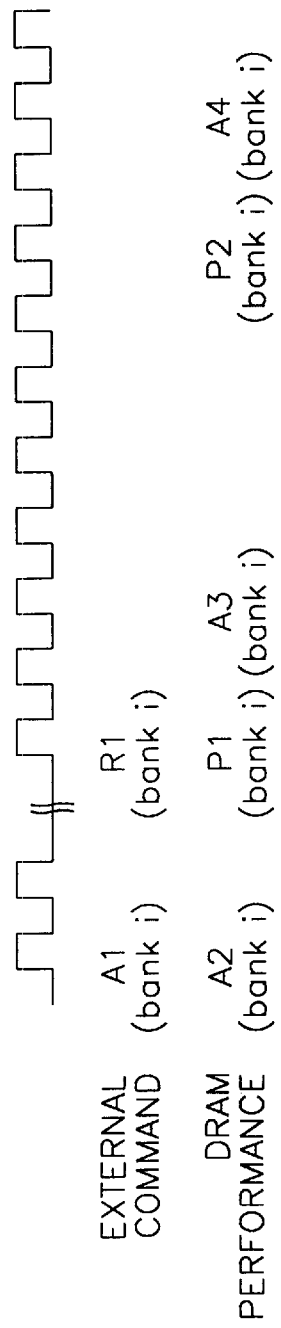
FIG. 5 is a diagram illustrating another example of refresh operations to be performed on an open bank in the semiconductor memory device of FIG. 3.

FIG. 5 is a diagram illustrating another example of refresh operations to be performed on an open bank in the semiconductor memory device of FIG. 3. Referring to FIGS. 3 and 5, if the memory controller 40 applies the refresh command R1 for the open bank i to the semiconductor memory device 50, the refresh controller 52 performs a refresh operation on the open bank i by precharging P1, activating A3, and precharging P2 the open bank i in response to the refresh command R1. After the refresh operation is performed, the refresh controller 52 activates A4 the completely refreshed bank i again.

As described above, only in the event that the memory controller 40 applies a refresh command to the semiconductor memory device 50 in order to refresh an open bank of the semiconductor memory device 50, the semiconductor memory device 50 responds by precharging P1 the open bank, refreshing A3 and P2 the precharged bank, and activating A4 the refreshed bank. This is In contrast with the prior art approach, under which the memory controller 40 must sequentially apply a precharge command, a refresh command, and an activation command in order to refresh an open bank and re-open the refreshed bank. However, in the present invention, the memory controller 40 applies only the refresh command to the semiconductor memory device 50. Thus the number of commands applied from the memory controller 40 to the semiconductor memory device 50 via the memory bus 65 can be reduced, and the efficiency of the memory bus 65 is therefore increased.

Figure 6:
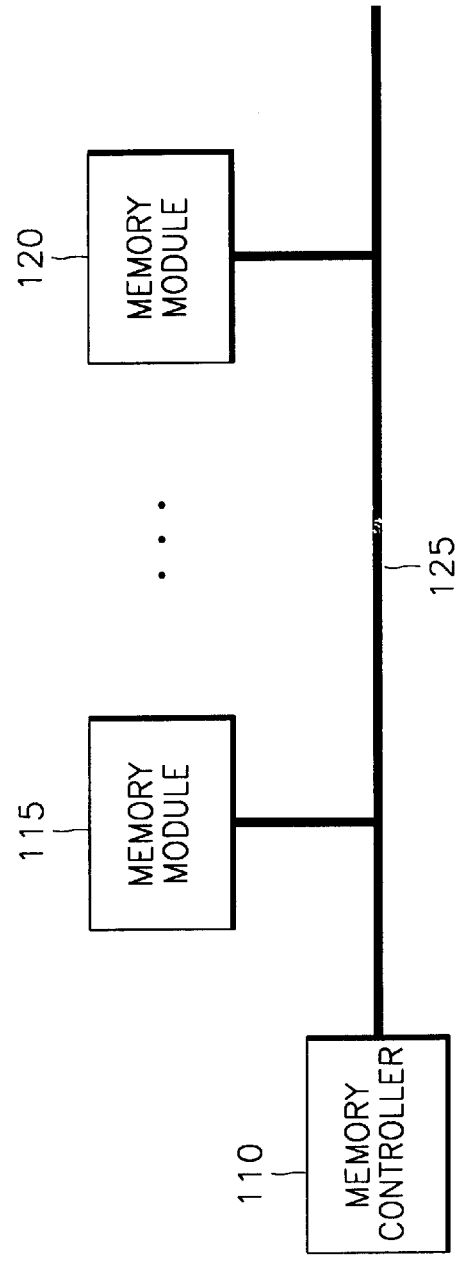
FIG. 6 is a block diagram illustrating a memory system according to a second embodiment of the present invention, which performs the refresh method shown in FIG. 2.

FIG. 6 is a block diagram illustrating a memory system according to a second embodiment of the present invention, including a memory controller 110 and a plurality of semiconductor memory modules 115 and 120, which are connected with a memory bus 125. Here, a plurality of semiconductor memory devices are installed in each of the memory modules 115 and 120, and each of the semiconductor memory devices has the same structure as the semiconductor memory devices 50, . . . , 60 shown in FIG. 3 and performs the same operations as the semiconductor memory devices 50, . . . , 60. In other words, the memory controller 110 applies a refresh command and an activation command or only the refresh command to each of the semiconductor memory devices in order to an open bank of each of the semiconductor memory devices. Accordingly, the number of commands required for refreshing an open bank can be reduced, and the efficiency of the memory bus 125 can therefore be increased.

As described above, according to the memory system and the semiconductor memory device of the present invention, which are capable of increasing the efficiency of a memory bus, and the refresh method of the semiconductor memory device, a memory controller does not need to apply a precharge command to the semiconductor memory device before applying a refresh command to the semiconductor memory device in order to refresh an open bank but applies only the refresh command to the semiconductor memory device. In addition, the semiconductor memory device automatically performs an activation operation on the completely refreshed bank after refreshing the open bank, thereby considerably increasing the efficiency of the memory bus.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for refreshing an open bank of a semiconductor memory device under control of a memory controller in a memory system comprising a plurality of semiconductor memory devices and the memory controller for controlling the plurality of semiconductor memory devices, the method comprising:

(a) receiving a refresh command from the memory controller in order to refresh the open bank;
    (b) precharging the open bank in response to the refresh command, and
    (c) refreshing the precharged bank.

2. The method of claim 1 further comprising:

(d) activating the bank refreshed in step (c) so as to restore the refreshed bank to its former condition.

3. A semiconductor memory device, which refreshes a bank in response to a refresh command generated by a memory controller, the semiconductor memory device comprising a refresh controller, which first precharges the bank and then refreshes the precharged bank in response to the refresh command, if the bank to be refreshed is an open bank.

4. The semiconductor memory device of claim 3, wherein the refresh controller comprises:

a precharger precharging the corresponding bank in response to a precharge signal;
    an activator activating the corresponding bank in response to an activation signal; and
    a controller sequentially generating the precharge signal, the activation signal, and the precharge signal at predetermined time intervals in response to the refresh command if the bank to be refreshed is an open bank.

5. The semiconductor memory device of claim 3, wherein the refresh controller activates the open bank so as to restore the open bank to its former condition after the open bank is refreshed.

6. The semiconductor memory device of claim 5, wherein the refresh controller comprises:

a precharger precharging the corresponding bank in response to a precharge signal;
    an activator activating the corresponding bank in response to an activation signal; and
    a controller sequentially generating the precharge signal, the activation signal, the precharge signal, and the activation signal at predetermined time intervals in response to the refresh command if the bank to be refreshed is an open bank.

7. A memory system comprising a plurality of semiconductor memory devices and a memory controller for controlling the semiconductor memory device, wherein the each of the plurality of semiconductor memory devices comprises a refresh controller, which precharges a bank to be refreshed and then refreshes the precharged bank in response to the refresh command if the bank to be refreshed is an open bank.

8. The memory system of claim 7, wherein the refresh controller comprises:

a precharger precharging the corresponding bank in response to a precharge signal;
    an activator activating the corresponding bank in response to an activation signal; and
    a controller sequentially generating the precharge signal, the activation signal, and the precharge signal at predetermined time intervals in response to the refresh command if the bank to be refreshed is an open bank.

9. The memory system of claim 7, wherein the refresh controller activates the open bank so as to restore the open bank to its former condition after the open bank is completely refreshed.

10. The memory system of claim 9, wherein the refresh controller comprises:

a precharger precharging the corresponding bank in response to a precharge signal;
    an activator activating the corresponding bank in response to an activation signal; and
    a controller sequentially generating the precharge signal, the activation signal, the precharge signal, and the activation signal at predetermined time intervals in response to the refresh command if the bank to be refreshed is an open bank.

* * * * *